United States Patent [19]

Kobayakawa

[11] Patent Number: 4,875,061
[45] Date of Patent: Oct. 17, 1989

[54] COLOR IMAGE RECORDING APPARATUS

[75] Inventor: Kouji Kobayakawa, Ichinomiya, Japan

[73] Assignee: Brother Kogyo Kabushiki Kaisha, Japan

[21] Appl. No.: 327,090

[22] Filed: Mar. 22, 1989

[30] Foreign Application Priority Data

Mar. 23, 1988 [JP] Japan .............................. 63-38997[U]

[51] Int. Cl.⁴ .............................................. G01D 15/00
[52] U.S. Cl. ..................................... 346/157; 346/160
[58] Field of Search .................... 346/157, 160, 107 R, 346/108; 355/4; 358/300, 302

[56] References Cited

U.S. PATENT DOCUMENTS

| | | | |
|---|---|---|---|
| 4,768,046 | 8/1988 | Minor et al. | 346/157 |
| 4,809,037 | 2/1989 | Sato | 346/157 |

Primary Examiner—Arthur G. Evans
Attorney, Agent, or Firm—Oliff & Berridge

[57] ABSTRACT

A color image recording apparatus which employs an intermediate recording medium such as a mask member carrying a monochromatic image and a colored original. The intermediate recording medium is superposed with a photosensitive pressure sensitive recording medium at an exposure zone, and light is irradiated thereon through the intermediate recording medium to provide a latent image on the photosensitive recording medium corresponding to the image on the intermediate recording medium. A color identification means is provided so as to identify color of the intermediate recording medium when it is positioned upstream of the exposure zone. The color identification means generates a signal indicative of the color, so that one of red, green, blue and white light in the light source is lighted in response to the signal.

6 Claims, 1 Drawing Sheet

COLOR IMAGE RECORDING APPARATUS

BACKGROUND OF THE INVENTION

The present invention relates to a color image recording apparatus in which a color image is formed on a photosensitive pressure sensitive image recording medium upon light irradiation thereto through a manually inserted colored original or a mask member on which a mask image is carried, images on the original or the mask member being formed in accordance with a color image information.

Copending U.S. patent application Ser. No. 184,576 filed on Apr. 21, 1988 discloses a color image recording apparatus using a mask member. According to the apparatus, each of mask images corresponding to trichromatic resoluted images of an original is formed on each of the mask members as an intermediate recording mediums at a monochromatic printer, and such mask member carrying the mask image is brought into intimate contact with an elontaged photosensitive pressure sensitive image recording medium at a given position and is subjected to light exposure at an exposure unit. In this case, the irradiated light has a specific light wavelength corresponding to the resoluted color with which the mask member is recorded with the mask image. Upon the exposure, a color latent image is formed on the recording meidum. The photosensitive pressure sensitive recording meidum carrying the latent image is then superposed with a separate developer sheet and these are subjected to pressure-developing at a pressure developing unit disposed at downstream of the exposure unit, so that a color output image is formed on the developer sheet.

Incidentally, the image recording medium used is so called a transfer type image recording medium described in U.S. Pat. No. 4,399,209. The image recording medium includes a first image recording medium (the above mentioned photosensitive pressure sensitive recording medium) and a second image recording medium (the above mentioned developer sheet), and the first image recording medium is provided with microcapsules which encapsulate therein a first material having first and second phase dependent on light exposure. The developer medium is provided with a second material which provides an output image upon reaction with the first material. The light exposed microcapsules are photo-cured, whereas non-exposed microcapsules are ruptured upon pressure application, so that the first material is flowed out of the microcapsules to react with the second material.

FIG. 1 shows a color imge recording apparatus 1' according to the copending U.S.Patent Application having a mask image forming unit 41 and a color image recording unit 42. The mask image forming unit 41 may be a monochromatic laser printer 1 of an electrophotographic type. Referring first to the laser printer, a polygon scanner 2 is disposed above a photosensitive drum 3 electrically chargeable. The scanner 2 irradiates a laser beam on the charged photosensitive drum 3 to form an electrostatic latent image thereon in accordance with an image information or recording data transferred from a host computer (not shown). The drum 3 having the latent image formed thereon is subjected to development by a developing unit 4 where toners are accumulated, so that a toner image is provided over the peripheral surface of the drum 3. The toner image is then transferred to a regular sheet or an OHP (over head projector) sheet fed from a sheet feeding cassette 5. The transferred toner image on the sheet is then fixed by a fixing unit 6. This image fixed sheet serves as an intermediate sheet or a mask member 22 in the image recording apparatus according to this invention.

The color image recording unit 42 generally includes a sheet chute 8, an exposure unit having an exposure zone 20, light sources 21R, 21G and 21B, a developer sheet cassette 27, a pressure developing unit 28, a thermal fixing unit 26, a discharge tray 25, and a manual tray 29. The sheet chute 8 is disposed adjacent the printer 41 for feeding mask member 22(hereinafter also referred to as intermediate sheet 22) from the monochromatic laser printer 41 to the exposure zone 20. The exposure zone 20 extends in horizontal direction and is disposed below the light sources 21R, 21G and 21B. A photosensitive roll cassette 24A is positioned at lower portion of one end of the exposure zone 20, and a take up means 37 is provided at a lower position of the zone 20. The rolled photosensitive sheet 24 is pulled out of the cassette 24A and taken-up by the take up means 37 through the exposure zone 20.

On the exposure zone 20, the intermediate sheet 22 is set in close contact with a photosensitive pressuresensitive sheet 24. The light source 21W for white color light and the light sources 21R, 21G, 21B for three primary colors of red, green and blue are selectively used for light irradiation to the photosensitive sheet 24 through the mask member 22.

The developer sheet cassette 27 is disposed at a lower portion of the image recording unit 42. The cassette 27 accommodates therein developer sheets whose one surface is provided with a developer material which react with a first material (chromogenic materials) encapsulated in microcapsules coated on the top surface of the photosensitive pressure-sensitive sheet 24.

The pressure developing unit 28 is disposed downstream of the exposure zone 20 for developing the developer sheet superposed on the photosensitive pressure-sensitive sheet 24. The pressure developing unit 28 includes a pressure roller 28a.

The thermal fixing unit 26 is adapted for fixing the output image on the developer sheet. The discharge tray 25 is disposed downstream of the fixing unit 26 for receiving the developer sheet on which the output image is provided. The manual tray 29 is disposed at a position adjacent another end of the exposure zone 20 for manually feeding the intermediate sheet or colored original C into the image recording unit 42. The discharge tray 23 is disposed at a position adjacent to the one end of the exposure zone 20 for receiving the intermediate sheet 22. A mask member carrying means 22a is disposed for transferring the intermediate sheet 22 over the photosensitive sheet 24. More specifically, the carrying means 22a includes an endless belt formed of electrically insulative material such as PET, and a static electricity generators such as a corotoron (not shown) disposed at end portions of the belt. The endless belt has an static electricity by the generators, so that the mask member 22 is electrically sticked or suspended from the belt. Further, a leading edge aligning means such as a roller 31 is disposed at an outlet end portion of the chute 8 for position alignment of the leading edge of the mask member 22 supplied from the printer 41. Further, position adjusting rollers 32 is disposed at an inlet end of the exposure zone 20 for adjusting exposure position with respect to the mask member 22, so that color slip on the photosensitive sheet 24 is avoidable.

An option switch 41 is provided in the printer 41 for selectively providing a color mode operation and a monochromatic mode operation. If colored original C is intended to be inserted into the image recording unit through the manual insertion tray 29, the option switch is switched into the color mode, and the colored original C is inserted through the tray 29. In this case the white light source 21W is lighted. Further, light switching means 12' is connected to the option switch 33 for selectively lighting the one of the lights 21R, 21G, 21B and 21W.

A description will be given below of the operation of the apparatus in a color mode. In the color mode, the mask member 22 which carries color resoluted red image prepared by the laser printer 41 reaches the leading edge aligning roller 31 and is subjected to position alignment after passing through the chute 8.

Then the mask member 22 is electrostatically adhered by means of the static electricity generator to the intermediate sheet conveying means 22a and the mask member 22 is conveyed to a given position of the exposure zone 20.

In the exposure zone 20, the mask member 22 is brought into close contact with the photosensitive pressure-sensitive sheet 24, and the mask member 22 and the sheet 24 are exposed to light by the light source 21R to form the latent image corresponding to the mask member 22 on the sheet 24. After exposing to light by the light source 21R, the mask member 22 is discharged onto the discharge tray 23. The same operation is executed for the remaining green mask member and the blue mask member with applying light from the green light source, and then the blue light source while the photosensitive pressure sensitive sheet 24 is maintained at the initial exposure position, and a color latent image can be formed on the identical zone of the photosensitive pressure-sensitive sheet 24.

Thus exposed photosensitive pressure sensitive sheet 24 is then transferred to the pressure developing unit 28, and after the pressure development is completed, the photosensitive pressure-sensitive sheet 24 is wound up by the take-up means 37.

When the colored original C is intended to be used, the option switch 33 is switched into its color mode, and the colored original C is inserted through the manual tray 29 while lighting the white light source 21W. On the other hand, if the plurality of monochromatic mask members 22 on which color images are respectively formed thereon based on the color information are intended to be used, the option switch 33 is switched into the monochromatic mode, and the above described light exposure with successively lighting red, green and blue lights is conducted.

With the structure, if one of the colored original C and the monochromatic mask member is inserted into the manual insertion tray 29, an operator must beforehand recognize the kind, and must manually operate the option switch 33 in accordance with the kind. That is, if the colored original C is inserted, the switch 33 must be turned into the color mode, and if the monochromatic mask member is inserted, the switch 33 must be turned into the monochromatic mode so as to operate the light source selection means 12' for lighting the optimum light.

Therefore, if the option switch 33 is mistakingly switched, a desired output color image cannot be obtained, and as a result, sheets may be wasted and total operation period is prolonged due to correction to the switching operation.

SUMMARY OF THE INVENTION

It is therefore, an object of the present invention to overcome the above-described drawbacks, and to provide an improved color image recording apparatus in which one of colored lights in a light source can be automatically selected to be lighted in accordance with kind of intermediate image recording medium such as a mask member carrying a monochromatic mask image and a colored original when one of them is inserted through a manual insertion tray.

Another object of this invention is to provide such improved color image recording medium in which a desirable output color image is obtainable without fail, yet manual mode selecting operation can be eliminated regardless of the kind of the intermediate recording medium (either mask member carrying the monochromatic image or the colored original), or irrespective of feeding fashion of the intermediate recording medium (either the automatic feeding of the mask member from the laser printer into the image recording unit or manual insertion of the intermediate recording medium from the manual insertion tray into the recording unit).

These and other objects of this invention are attained by providing a color image recording apparatus for recording an image on an image recording medium through an intermediate recording medium which carries an intermediate image which is one of a monochromatic color image or colored original image, the intermediate recording medium being supplyed from one of a monochromatic image forming unit and a manual insertion tray, the intermediate recording medium being superposed with the image recording medium at an exposure zone for light exposure for forming a latent image on the image recording medim; the apparatus comprising; light source for irradiating one of red, green, blue and white light onto the image recording medium through the intermediate recording medium at the exposure zone; a sheet deliverying and aligning means disposed upstream of the exposure zone for delivering aligned intermediate recording medium to the exposure zone, the delivering and aligning means being positioned downstream of the monochromatic image forming unit and the manual insertion tray; color identification means disposed at a position adjacent the sheet deliverying and aligning means for identifying colors of either the mask member or the colored original, the identification means generating a signal indicative of the colors; and, light selection means for automatically lighting one of the red, green, blue and white light in response to the signal.

With the structure, the color identification means distinguishes monochromatic image from color image carried on the intermediate recording medium, and the identification means generates signal indicative of the color. This signal is transmitted to the light selection means so as to light one of the colored lights in the light source. Manual mode selecting operation for changing operation mode (monochromatic operation or color copying operation) can be obviated irrespective of the kinds of the intermediate recording meidum.

DETAILED DESCRIPTION OF THE INVENTION

Figure 2:
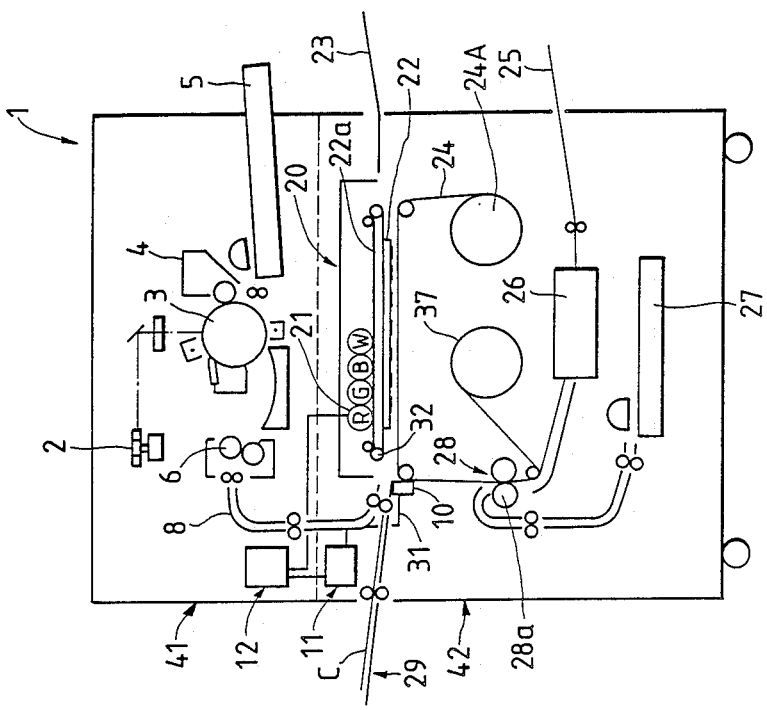
Figure 1:
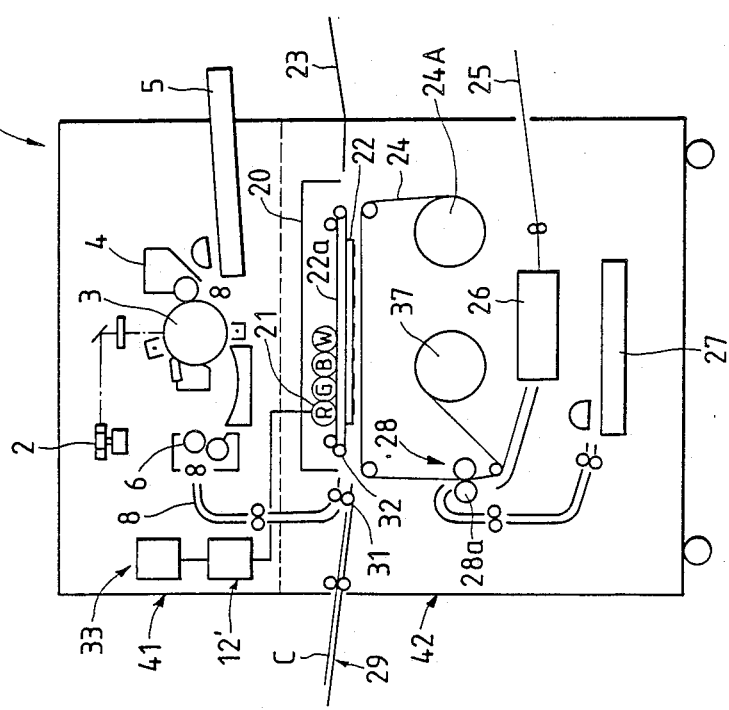
FIG. 1 is a schematic cross-sectional view showing an image recording apparatus disclosed in the copending U.S. patent application Ser. No. 184,576; and, FIG. 2 is a schematic cross-sectional view showing an image recording apparatus according to the present invention.

An image recording apparatus according to one embodiment of this invention is shown in FIG. 2, wherein like parts and components are designated by the same reference numerals and characters as those shown in FIG. 1 for eliminating duplicating descriptions.

According to the invention, a color identification means is provided. The identification means includes a color detection means 10 and a color judging means 11. The color detection means 10 is provided at a path of a mask member 22 or an colored original C and between a sheet edge aligning roller 31 and an exposure position adjusting roller 32. The color detection means 10 is provided so as to recognize and read the color of an intermediate recording medius, i.e., one of the mask member and the colored original C whether it carries either the monochromatic or color image. Further a color judging means 11 is connected to the color detection means 10 for judging the color. Furthermore, a light source selection means 12 is connected to the judging means 11 which selectively lights one of the red, green, blue and white lights in the light source 21 in response to a relay signal from the judging means 11.

More specifically, the color detection means 10 includes contact type three image sensors, each of which is covered with red filter, green filter and blue filters, respectively. These sensors provide output signal to the judging means 11, when the light reflected at or transmitted through the mask member 22 or the colored original C is applied to these sensors. The judging means 11 stores color signals. If the output signal from the red, green and blue image sensors is coincident with the stored singnal, the judging means 11 determines that the used intermediate member is the mask member carrying the monochromatic image. On the other hand, if the output signal from these sensors is different from the stored signal, the judging means 11 determines that the used intermediate member is the colored original C. The judging means 11 provides the relay signal indicative of the color of the intermediate member to the light selection means 12. The light selection means 12 automatically selects one of the lights to be lighted in response to the relay signal. As a modification, the color judging means 11 can be assembled into the color detection means 10. Further, another type of the color detection means 10 is available other than the above described image sensors.

In operation, after the operator inserts the intermediate recording medium (either the mask member carrying the monochromatic image or the colored original C) through the manual insertion tray 29, the medium is subjected to leading edge alignment by the edge alignment roller 32 similar to the case where the mask member 20 is delivered from the laser printer 41 through the chute 8. During travel of the intermediate recording medium toward the position adjusting roller 32, the color detection means 10 reads the color, and the color judging means 11 determines the color on the basis of the color data sent from the identification means 10. If the judging means 11 determines that the intermediate recording medium carries color image, the light selection means 12 selects the white light 21W, so that the intermediate recording medium together with the photosensitive recording medium 24 are subjected to exposure by the white light at the exposure zone 20. Subsequent operations are the same as those conducted in the copending U.S. patent application.

On the other hand, in case the intermediate recording medium is the mask image carrying the monochromatic image, the light selection means 12 selects one of the red, green and blue light source to be lighted corresponding to the intended specific color (actually, not a visible color, but the monochromatic image indicative of one specific latent color imparted at the laser printer 41). In other words, the judging means 11 determines the monochromatic image, so that monochromatic mode is provided to successively light red light, green light and the blue light in accordance with the employment of the red mask member, the green mask member and the blue mask member.

The monochromatic printer 41 used in the above embodiment is not restricted to the laser printer, but may be of any type such as an LED printer, a liquid crystal printer or a thermal printer, as long as it can produce trichromatic resolution mask image. With a desk top type printer in use, this printer may be mounted on the top of the present color image recording unit 42 to easily provide a color image. Further, with a large printer in use, it would be impossible to mount such large printer on the unit 42. However, the mask images each carrying trichromatic resolution mask images produced by the large printer can be easily introduced into the present apparatus 20 through the manual tray 29, to thus produce a color output image.

In view of the foregoing, according to the present invention, desirable output color image is obtainable without fail, yet manual mode selecting operation can be eliminated regardless of the kind of the intermediate recording medium (either mask member carrying the monochromatic image or the colored original), or irrespective of feeding fashion of the intermediate recording medium (either the automatic feeding of the mask member from the laser printer into the image recording unit or manual insertion of the intermediate recording medium from the manual insertion tray into the recording unit).

What is claimed is:

1. A color image recording apparatus for recording an image on an image recording medium through an intermediate recording medium which carries an intermediate image which is one of a monochromatic color image or colored original image, said intermediate recording medium being supplied from one of a monochromatic image forming unit and a manual insertion tray, said intermediate recording medium being superposed with said image recording medium at an exposure zone for light exposure for forming a latent image on said image recording medium; said apparatus comprising;
    light source for irradiating one of red, green, blue and white light onto said image recording medium through said intermediate recording medium at said exposure zone;
    a sheet deliverying and aligning means disposed upstream of said exposure zone for delivering aligned intermediate recording medium to said exposure zone, said delivering and aligning means being positioned downstream of said monochromatic image forming unit and said manual insertion tray;

color identification means disposed at a position adjacent said sheet deliverying and aligning means for identifying colors of said intermediate image, said identification means generating a signal indicative of said colors; and, light selection means for automatically lighting one of said red, green, blue and white light in response to said signal.

2. The color image recording apparatus as defined in claim 1, wherein said image recording medium comprises a first image recording meidum and a second image recording medium, said first image recording medium comprising a photosensitive pressure sensitive recording medium provided with microcapsules, said microcapsules encapsulating therein a first material having a first and second phases dependent on light exposure, and said second image recording medium comprising a developer medium provided with a second material which provides an output image upon reaction with said first material.

3. The color image recording apparatus as defined in claim 1, wherein said color identification means comprises color detection means for detecting a color of said intermediate recording medium, and a judging means connected to said color detection means for judging said color, said light selection means being connected to said judging means.

4. The color image recording apparatus as defined in claim 3, wherein said color detection means comprises contact type image sensors covered with red filter, green filter and blue filter, respectively.

5. The color image recording apparatus as defined in claim 2, wherein said intermediate recording medium comprises a mask member, and wherein said monochromatic image carried on said mask member is prepared based on color image data by trichromatic resolution;

6. The color image recording apparatus as defined in claim 5, wherein said photosensitive pressure sensitive recording medium is exposed to one of said lights through said mask member in close contact therewith; and wherein said developer medium and said photosensitive pressure sensitive recording medium carrying said latent image are superposed with each other and pressed together at a pressure developing unit to thereby develope a color visible image on said developer medium.

* * * * *